United States Patent
Wang et al.

(10) Patent No.: US 10,606,421 B2
(45) Date of Patent: Mar. 31, 2020

(54) 3D TOUCH PANEL AND MANUFACTURING METHOD THEREOF, TOUCH DRIVE DEVICE AND METHOD, AND DISPLAY DEVICE

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Qiang Wang, Beijing (CN); Libin Liu, Beijing (CN)

(73) Assignees: BOE Technology Group Co., Ltd., Beijing (CN); ORDOS Yuansheng Optoelectronics Co., Ltd., Ordos, Inner Mongolia (CN)

( * ) Notice: Subject to any disclaimer, the term of this patent is extended or adjusted under 35 U.S.C. 154(b) by 245 days.

(21) Appl. No.: 15/237,837

(22) Filed: Aug. 16, 2016

(65) Prior Publication Data
US 2017/0269730 A1 Sep. 21, 2017

(30) Foreign Application Priority Data
Mar. 21, 2016 (CN) .......................... 2016 1 0162616

(51) Int. Cl.
*G06F 3/044* (2006.01)
*G06F 3/041* (2006.01)
*H01L 27/32* (2006.01)

(52) U.S. Cl.
CPC ............ *G06F 3/044* (2013.01); *G06F 3/0412* (2013.01); *G06F 3/0416* (2013.01);
(Continued)

(58) Field of Classification Search
CPC .................. G06F 3/0412; G06F 3/0416; G06F 2203/04103
See application file for complete search history.

(56) References Cited

U.S. PATENT DOCUMENTS

2007/0252614 A1* 11/2007 Jeon ..................... G02F 1/13454
324/760.01
2007/0257821 A1* 11/2007 Son ......................... G06F 3/016
341/22
(Continued)

FOREIGN PATENT DOCUMENTS

CN 101000921 A 7/2007
CN 102138120 A 7/2011
(Continued)

OTHER PUBLICATIONS

The First Chinese Office Action dated Feb. 14, 2018; Appln. No. 201610162616.8.
(Continued)

*Primary Examiner* — Kent W Chang
*Assistant Examiner* — Nathaniel P Brittingham
(74) *Attorney, Agent, or Firm* — Ladas & Parry LLP

(57) ABSTRACT

A tree-dimensional (3D) touch panel and a manufacturing method thereof, a touch drive device and method, and a display device are provided. The 3D touch panel includes a display backplate and a cover plate opposite to each other. The display backplate includes a display substrate, a plurality of first touch electrodes, first wirings, and a plurality of spacers. The cover plate includes a cover plate substrate, a plurality of second touch electrodes and second wirings formed on a surface of the cover plate substrate facing the display backplate, and a position touch layer formed on a surface of the cover plate substrate away from the display backplate. The position touch layer is configured to detect a touch position; and the first touch electrodes and the second touch electrodes correspond to each other in position and are both disposed at the spacers.

12 Claims, 2 Drawing Sheets

(52) U.S. Cl.
    CPC .............. *G06F 2203/04103* (2013.01); *G06F 2203/04105* (2013.01); *G06F 2203/04111* (2013.01); *H01L 27/323* (2013.01)

(56) References Cited

U.S. PATENT DOCUMENTS

| | | | |
|---|---|---|---|
| 2008/0018243 A1 | 1/2008 | Ishiguro et al. | |
| 2011/0157087 A1 | 6/2011 | Kanehira et al. | |
| 2012/0212701 A1 | 8/2012 | Hwang et al. | |
| 2014/0253502 A1* | 9/2014 | Cho | G06F 3/0412 345/174 |
| 2014/0267152 A1 | 9/2014 | Curtis | |
| 2014/0313435 A1* | 10/2014 | Cho | H01J 9/20 349/12 |
| 2015/0041778 A1* | 2/2015 | Chang | H01L 27/3262 257/40 |
| 2015/0042614 A1* | 2/2015 | Pak | G06F 3/044 345/174 |
| 2016/0202817 A1* | 7/2016 | Choi | G02F 1/13338 345/174 |
| 2017/0016930 A1 | 1/2017 | Qiu et al. | |
| 2017/0075452 A1* | 3/2017 | Kim | G06F 3/044 |
| 2017/0185180 A1* | 6/2017 | Chae | G06F 3/0412 |
| 2017/0185203 A1* | 6/2017 | Seong | G06F 3/0412 |
| 2017/0207277 A1* | 7/2017 | Park | G06F 3/0412 |
| 2017/0213873 A1* | 7/2017 | Bok | H01L 27/323 |
| 2017/0269730 A1* | 9/2017 | Wang | G06F 3/044 |
| 2017/0277288 A1* | 9/2017 | Choi | G06F 3/041 |

FOREIGN PATENT DOCUMENTS

| | | |
|---|---|---|
| CN | 103823592 A | 5/2014 |
| CN | 104423748 A | 3/2015 |
| CN | 105051659 A | 11/2015 |
| CN | 105070720 A | 11/2015 |
| CN | 105302372 A | 2/2016 |
| JP | 2009-534757 A | 9/2009 |

OTHER PUBLICATIONS

The Second Chinese Office Action dated Jun. 14, 2018; Appln. No. 201610162616.8.

* cited by examiner

3D TOUCH PANEL AND MANUFACTURING METHOD THEREOF, TOUCH DRIVE DEVICE AND METHOD, AND DISPLAY DEVICE

TECHNICAL FIELD

The present invention relates to a tree-dimensional (3D) touch panel and a manufacturing method thereof, a touch drive device and method, and a display device.

BACKGROUND

With the rapid development of display technology, touch screen, also known as touch panel, has been widely applied in various electronic products and is spread in people's lives. Capacitive touch panel is one type of common touch panels, and the principle thereof is to detect the touch position according to the variation of the capacitance produced when a finger is close to a capacitive touch layer.

The conventional capacitive touch panel can only provide touch position detection. However, with the continuous development of touch technology, more and more products utilize the touch panel to directly operate destination objects. A touch force detection component is additionally arranged on the touch panel to achieve the touch force detection function, so that more different operations can be triggered, which not only is conducive to user operation but also can afford pleasure to users. Therefore, the capacitive touch panel with the touch force detection function is more and more favored by touch panel manufacturers.

The conventional capacitive touch panel mainly achieves touch position detection and touch force detection by the respective arrangement of a touch sensor and a pressure sensor, the bonding of the touch sensor and the pressure sensor via an optical adhesive, and the fixing of the touch sensor and the pressure sensor on a cover plate. However, in the conventional capacitive touch panel, as both the touch sensor and the pressure sensor must independently occupy the inner space of a display device, the space utilization rate is low.

SUMMARY

An embodiment of the disclosure provides a three-dimensional (3D) touch panel, comprising a display backplate and a cover plate which are arranged opposite to each other, wherein the display backplate includes a display substrate, a plurality of first touch electrodes and first wirings connected with the plurality of first touch electrodes, formed on a surface of the display substrate facing the cover plate, and a plurality of spacers formed on the first touch electrodes; the cover plate includes a cover plate substrate, a plurality of second touch electrodes and second wirings connected with the plurality of second touch electrodes, formed on a surface of the cover plate substrate facing the display backplate, and a position touch layer formed on a surface of the cover plate substrate away from the display backplate; the position touch layer is configured to detect a touch position; and the first touch electrodes and the second touch electrodes correspond to each other in position and are both disposed at the spacers.

Another embodiment of the disclosure provides a method for manufacturing a 3D touch panel, comprising: forming a display backplate; forming a cover plate; and bonding the display backplate and the cover plate, and forming a plurality of spacers between the display backplate and the cover plate; wherein forming the display backplate includes: forming a plurality of first touch electrodes and first wirings connected with the plurality of first touch electrodes on a surface of a display substrate facing the cover plate, forming the cover plate includes: forming a plurality of second touch electrodes and second wirings connected with the plurality of second touch electrodes on a surface of a cover plate substrate facing the display backplate; and forming a position touch layer on a surface of the cover plate substrate away from the display backplate, in which the position touch layer is configured to detect a touch position, and wherein the plurality of first touch electrodes on the display substrate and the plurality of second touch electrodes on the cover plate are opposite to each other to form a plurality of touch electrode couples after bonding the display backplate and the cover plate, and the first touch electrode and the second touch electrode in each touch electrode couple are respectively disposed at one end of corresponding spacer facing the display backplate and one end facing the cover plate.

Another embodiment of the disclosure provides a touch drive device, configured for touch driving of the 3D touch panel as mentioned above, comprising: a position detection module configured to determine a touch position by touch drive detection through the position touch layer; and a force detection module configured to determine a touch force by detection of capacitance variation between the first touch electrodes and the second touch electrodes through the first wirings and the second wirings.

Another embodiment of the disclosure provides a display device, comprising the 3D touch panel and the touch drive device as mentioned above.

Still another embodiment of the disclosure provides a touch drive method, used for touch driving of the 3D touch panel as mentioned above, comprising: detecting the touch position through the position touch layer; and determining a touch force by detection of capacitance variation between the first touch electrodes and the second touch electrodes.

BRIEF DESCRIPTION OF THE DRAWINGS

Simple description will be given below to the accompanying drawings of the embodiments to provide a more clear understanding of the technical proposals of the embodiments of the present invention. Obviously, the drawings described below only involve some embodiments of the present invention but are not intended to limit the present invention.

DETAILED DESCRIPTION

For more clear understanding of the objectives, technical proposals and advantages of the embodiments of the present invention, clear and complete description will be given below to the technical proposals of the embodiments of the present invention with reference to the accompanying drawings of the embodiments of the present invention. Obviously, the preferred embodiments are only partial embodiments of the present invention but not all the embodiments. All the other embodiments obtained by those skilled in the art without creative efforts on the basis of the embodiments of the present invention illustrated shall fall within the scope of protection of the present invention.

Figure 1:
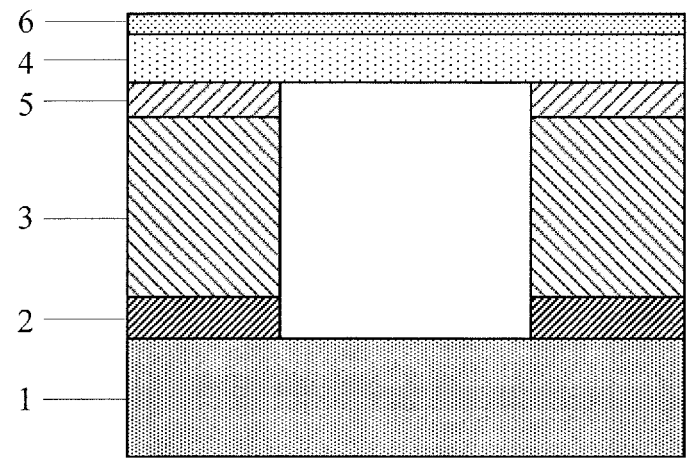
FIG. 1 is a schematic structural view of a 3D touch panel provided by one embodiment of the present invention.

FIG. 1 is a schematic structural view of a 3D touch panel provided by the embodiment of the present invention. As illustrated in FIG. 1, the 3D touch panel comprises a display backplate and a cover plate which are bonded with each other.

The display backplate includes a display substrate 1, a plurality of first touch electrodes 2 and first wirings connected with the plurality of first touch electrodes 2, formed on one surface of the display substrate 1 facing the cover plate (an upper surface of the display substrate 1), and a plurality of spacers 3 formed on the first touch electrodes 2.

The cover plate includes a cover plate substrate 4, a plurality of second touch electrodes 5 and second wirings connected with the plurality of second touch electrodes 5, formed on one surface of the cover plate substrate 4 facing the display backplate (a lower surface of the cover plate substrate 4), and a position touch layer 6 formed on one surface of the cover plate substrate 4 away from the display backplate (an upper surface of the cover plate substrate 4). The first touch electrode 2 and the second touch electrode 5 correspond to each other in position and are both disposed at the spacer 3.

For instance, the first touch electrodes 2 and the second touch electrodes 5 are opposite to each other to form a plurality of touch electrode couples, and the first touch electrode 2 and the second touch electrode 5 in each touch electrode couple are respectively disposed at one end of corresponding spacer 3 facing the display backplate and one end facing the cover plate.

For instance, a capacitor is formed by the first touch electrode and the second touch electrode in each touch electrode couple.

In the 3D touch panel provided by the embodiment of the present invention, the plurality of first touch electrodes 2 are formed on the display substrate 1; the plurality of second touch electrodes 5 are formed on the cover plate substrate 4; the second touch electrode 5 and the first touch electrode 2 correspond to each other in position and are both disposed at the spacer 3; the touch capacitor is formed by the first touch electrode 2 and the second touch electrode 5; and the spacer 3 is regarded as a capacitor dielectric of the touch capacitor. In the case of touch, the second touch electrode 5 at corresponding touch position of the cover plate substrate 4 will be deformed due to corresponding touch pressure, so that the distance between the first touch electrode 2 and the second touch electrode 5 can change, and hence the capacitance between the first touch electrode 2 and the second touch electrode 5 can change. Thus, the touch force can be detected by the detection of the capacitance variation between the first touch electrode 2 and the second touch electrode 5.

In the embodiment of the present invention, the first touch electrodes 2 and the second touch electrodes 5 for achieving touch force detection are respectively integrated on the display substrate 1 and the cover plate substrate 4 and are both disposed at the spacers 3, so that the space of the spacers 3 can be fully utilized, and hence the spacers 3 not only are taken as supporting elements of the display substrate 1 and the cover plate substrate 4 but also are regarded as the capacitor dielectrics of the touch capacitors formed by the first touch electrodes 2 and the second touch electrodes 5. Thus, the embodiment of the present invention not only can achieve touch force detection but also can save the internal space of the display device and improve the space utilization rate. Moreover, the 3D touch detection of the touch panel can be achieved by position detection through the position touch layer 6 on the cover plate substrate 4.

It should be understood that the spacer 3 has specific stress or elasticity, namely in the case of touch, the spacer 3 can be compressed down under a downward acting force, and in the case of touch removal, the spacer 3 can be restored to initial position.

The position touch layer 6 is configured to detect the touch position. The specific structure thereof may refer to the prior art. No limitation will be given in the embodiment of the present invention. For instance, two layers of touch electrodes may be formed on the upper surface of the cover plate substrate 4. One layer is taken as emission electrodes and the other layer is taken as sensing electrodes. Moreover, the position touch layer is formed by touch scanning lines Tx connected with the emission electrodes and touch sensing lines Rx connected with the sensing electrodes. The working process thereof is that: voltage signals of the touch sensing lines Rx coupled by mutual capacitors are detected when touch drive signals are applied to metal electrode lines taken as the touch drive lines Tx. In the process, if the panel is touched by a finger, the capacitance between the emission electrodes and the touch electrodes will change, and hence the voltage detected by the touch sensing lines Rx can change. Thus, the touch position can be determined according to the variation of the voltage signals.

In some examples, the touch position detection and the touch force detection may be respectively achieved by a position detection module and a force detection module in a touch drive device and do not interfere with each other.

Figure 2:
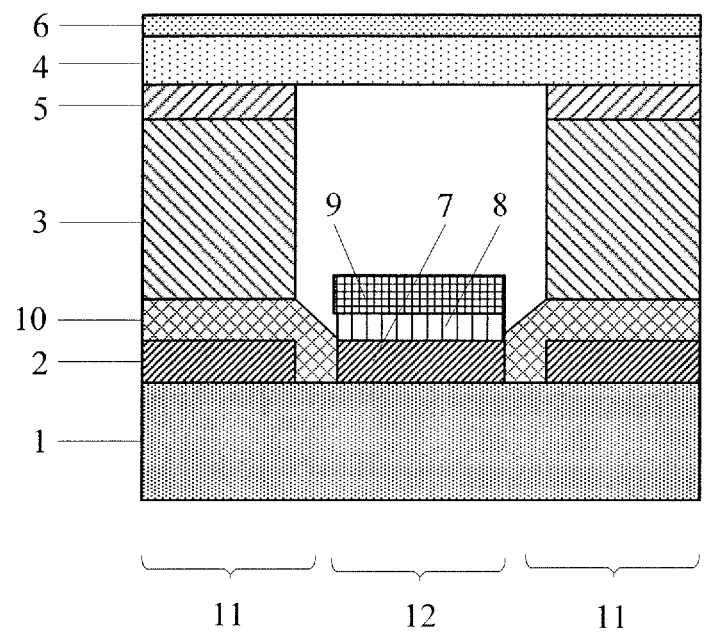
FIG. 2 is a schematic structural view of a 3D touch panel provided by another embodiment of the present invention.

On the basis of the embodiment as shown in FIG. 1, in another embodiment of the present invention, a touch component and a display component are integrally designed. As illustrated in FIG. 2, in another embodiment, the display backplate in the 3D touch panel further includes a plurality of pixel units formed on the display substrate 1. Each pixel unit includes a pixel electrode 7, an organic emission layer 8 and a common electrode 9; the pixel electrodes 7 and the first touch electrodes 2 are arranged in the same layer; and a (Pixel Defining Layer) PDL 10 is formed between the first touch electrodes 2 and the pixel electrodes 7. As the touch component and the display component are integrally designed, the thickness of the display device can be reduced after the 3D touch panel provided by the embodiment of the present invention is mounted into the display device.

In the manufacturing process, the first touch electrodes 2 and the pixel electrodes 7 in FIG. 2 may be formed by the same process, for instance, the process may include: forming an electrode layer on the display substrate 1; and obtaining an electrode layer pattern including the first touch electrodes 2 and the pixel electrodes 7 by patterning the electrode layer via mask process.

In some examples, the common electrode 9 in the pixel unit is taken as a cathode of the organic emission layer 8; the pixel electrode 7 is taken as an anode of the organic emission layer 8; and external voltage is connected with the common electrode 9 and provides cathode voltage for the common electrode 9. As the common electrodes 9 in the pixel units are all required to be connected with the external voltage, for the convenience of wiring, optionally, the common electrodes 9 in the pixel units may be communicated with each other through third wirings. At this point, the cathode voltage may be provided for the common electrodes 9 by the connection with the external voltage through a connecting line.

Formation of the PDL 10 between the first touch electrodes 2 and the pixel electrodes 7 is to prevent both sides of the pixel electrodes 7 (namely the left and the right of the pixel electrode 7 in FIG. 2) from being exposed in the air and oxidized and avoid affecting the luminous efficiency of the pixel units. For instance, as the first touch electrodes 2 and the pixel electrodes 7 are mutually independent, there are gaps between both, and the pixel electrodes 7 are taken as the anodes of the organic emission layers 8 in the pixel units. If the pixel electrodes are exposed in the air and oxidized, for instance, when the pixel electrodes are made from indium tin oxide (ITO), both sides of the pixel electrodes are exposed in the air and are oxidizable, so the luminous efficiency of the pixel units can be inevitably affected. In the embodiment of the preset invention, the PDL 10 is formed between the first touch electrodes 2 and the pixel electrodes 7 and configured to protect the pixel electrodes 7 and avoid the oxidization of the pixel electrodes. Moreover, the PDL 10 can also isolate the first touch electrodes 2 and the pixel electrodes 7. When the organic emission layer 8 is evaporated on the pixel electrode 7 subsequently, namely organic luminescent materials are evaporated, droplets of the organic luminescent materials flowing to an area of the first touch electrode 2 adjacent to the pixel electrode 7 are avoided. Furthermore, the PDL 10 can also effectively avoid the mutual pollution of the organic luminescent materials in luminous regions with different colors of adjacent pixel units.

It should be noted that both the spacers 3 and the PDL 10 are made from insulating materials and formed after the first touch electrodes 2 are formed. In order to simplify the process and reduce the process difficulty, for instance, in the embodiment of the present invention, the spacers 3 and the PDL 10 are made from same materials. The spacers 3 and the PDL 10 made from same materials can be formed by the same process. The specific forming process may include: forming an insulating material layer on the first touch electrodes 2; and obtaining an insulating material layer pattern including the spacers 3 and the PDL 10 by patterning the insulating material layer via half-mask process.

Figure 3:
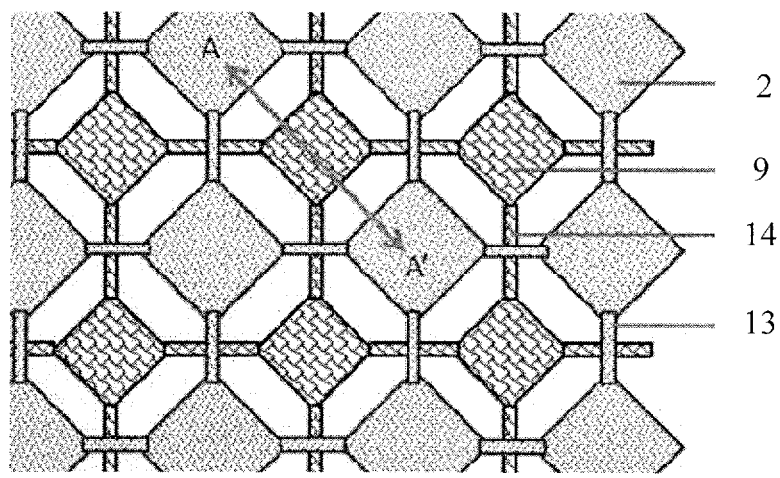
FIG. 3 is a wiring diagram of touch electrodes and common cathodes in the 3D touch panel provided by one embodiment of the present invention.

It should be noted that the first wirings for connecting the plurality of first touch electrodes 2 and the second wirings for connecting the plurality of second touch electrodes 5 may be arbitrarily designed as required. No limitation will be given in the embodiment of the present invention. In one embodiment, the wiring diagram of the first touch electrodes 2 in the embodiment of the present invention is as illustrated in FIG. 3, and a reticular structure is formed. That is to say, each first touch electrode 2 is connected with other adjacent first touch electrodes 2 through first wirings 13 in the first direction (the transverse direction) and the second direction (the longitudinal direction) intersected with the first direction in the same layer. Similarly, the second wirings for connecting the plurality of second touch electrodes 5 may also be so designed. Similarly, as illustrated in FIG. 3, third wirings 14 for connecting the common electrodes 9 in the pixel units can also be so designed.

It should be noted that areas of the touch capacitors formed by the first touch electrodes 2 and the second touch electrodes 5 are touch regions 11 which, as illustrated in FIG. 2, are used for touch detection. Areas of which the positions correspond to those of the pixel electrodes 7 are pixel regions 12 for display. FIG. 2 is a sectional view from a contact A on a touch region to a touch point A' on another touch region in FIG. 3.

The embodiment of the present invention further provides a method for manufacturing a 3D touch panel, which may be used for manufacturing any foregoing 3D touch panel. The manufacturing method comprises: S41: forming a display backplate; S42: forming a cover plate; and S43: bonding the display backplate and the cover plate.

The step S41 may, for instance, include: S411: forming a plurality of first touch electrodes and first wirings connected with the plurality of first touch electrodes on one surface of a display substrate facing the cover plate; and S412: forming a plurality of spacers on the first touch electrodes, in which projection areas of the spacers on the display substrate are the same with those of the first touch electrodes.

The step S42 may, for instance, include: S421: forming a plurality of second touch electrodes and second wirings connected with the plurality of second touch electrodes on one surface of a cover plate substrate facing the display backplate, in which the first touch electrode and the second touch electrode correspond to each other in position and are both disposed at the spacer; and S422: forming a position touch layer on one surface of the cover plate substrate away from the display backplate, in which the position touch layer is configured to detect the touch position.

Although the case that the spacers are formed on the first touch electrodes is illustrated in the embodiment, the embodiments of the present invention are not limited to the above examples, as long as the spacers can be disposed between the display substrate and the cover plate. For instance, the first touch electrodes, the second touch electrodes and the spacers may satisfy the following positional relationship: the plurality of first touch electrodes on the display substrate and the plurality of second touch electrodes on the cover plate are opposite to each other to form a plurality of touch electrode couples after bonding the display backplate and the cover plate, and the first touch electrode and the second touch electrode in each touch electrode couple are respectively disposed at one end of corresponding spacer facing the display backplate and one end facing the cover plate.

The plurality of first touch electrodes and the first wirings connected with the plurality of first touch electrodes in the step S411 may be formed by processes such as deposition, masking, development, etching and stripping. The plurality of spacers in the step S412 is formed by the spin coating of an insulating material layer, masking and etching in sequence. The specific process of forming the touch electrodes and corresponding wirings and the specific process of forming the spacers may refer to the prior art. No further description will be given here in the embodiment of the present invention.

The plurality of second touch electrodes and the second wirings connected with the plurality of second touch electrodes in the step S421 may also be formed by processes such as deposition, masking, development, etching and stripping. Touch capacitors are formed by the first touch electrodes and the second touch electrodes which correspond to each other in position, and are configured to detect the touch force of corresponding touch regions. The detailed description refers to relevant description on the embodiments of the 3D touch panel. No further description will be given here. The position touch layer in the step S422 is also formed by processes such as deposition, masking, development, etching and stripping. For instance, as electrode materials are formed on both surfaces of the cover plate substrate, optionally, the electrode materials may be simultaneously deposited on both surfaces of the cover plate substrate, and subsequently, the plurality of second touch electrodes and the second wirings connected with the plurality of second touch electrodes, disposed on a lower surface of the cover plate substrate, and the position touch layer disposed on an upper surface of the cover plate substrate are formed by double-sided exposure and etching, so that the forming time of the cover plate can be reduced.

In order to reduce the thickness of the display device comprising the 3D touch panel manufactured by the method provided by the embodiment of the present invention, for instance, the step S41 may further include the step of forming a plurality of pixel units on the display substrate, in which each pixel unit includes a pixel electrode, an organic emission layer and a common electrode. More specifically, the process may include the following steps: forming a plurality of pixel electrodes on the display substrate; forming the organic emission layers on the pixel electrodes; and forming a plurality of common electrodes and third wirings connected with the plurality of common electrodes on the organic emission layers.

The step of forming the pixel electrodes includes: forming the pixel electrodes in the same process of forming the first touch electrodes, namely forming an electrode layer on the display substrate; and obtaining an electrode layer pattern including the first touch electrodes and the pixel electrodes by patterning the electrode layer via mask process.

The step of forming the organic emission layers on the pixel electrodes is executed after the step S412. For instance, the step of forming the organic emission layers may include: forming the organic emission layers as illustrated in FIG. 2 by evaporating organic luminescent materials on the pixel electrodes via a metal mask.

In order to prevent both sides of the pixel electrodes from being oxidizable in the use process, prevent droplets of the organic luminescent materials from flowing to areas of the first touch electrodes adjacent to the pixel electrodes when the organic luminescent materials are evaporated on the pixel electrodes subsequently, and avoid the mutual pollution of the organic luminescent materials in luminous regions with different colors of adjacent pixel units, for instance, the process of forming the display backplate further includes the step of forming a PDL between the first touch electrodes and the pixel electrodes. In specific implementation, the step may be executed before the step S412.

In order to simplify the process and reduce the process difficulty, the PDL may also be formed at the same time when the spacers are formed in the step S412, namely the PDL and the spacers are formed by the same process. For instance, the process may include the following steps: forming an insulating material layer on the first touch electrodes; and obtaining an insulating material layer pattern by patterning the insulating material layer via mask process, in which the insulating material layer includes the spacers and the PDL.

Moreover, in order to reduce the process and shorten the forming time of the display backplate, for instance, the insulating material layer may be patterned by half-mask process, so the masking at different depths of different areas can be achieved by one mask process.

Figure 4:
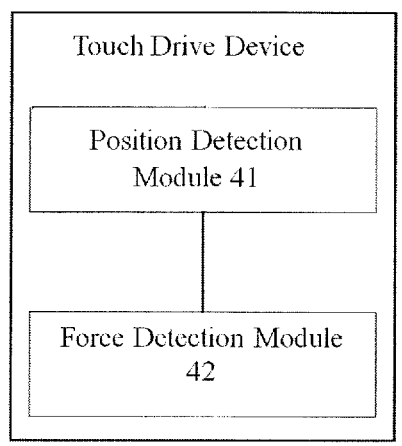
FIG. 4 is a schematic structural view of a touch drive device provided by one embodiment of the present invention.

FIG. 4 is a block diagram of a touch drive device provided by the embodiment of the present invention, used for the touch drive of any 3D touch panel provided by the embodiment of the present invention. As illustrated in FIG. 4, the touch drive device comprises: a position detection module 41 configured to determine the touch position by touch detection through the position touch layer; and a force detection module 42 configured to determine the touch force by the detection of the capacitance variation between the first touch electrodes and the second touch electrodes through the first wirings and the second wirings.

For instance, the principle of determining the touch position by the position detection module 41 can adopt the prior art and the content thereof refers to relevant description on the embodiments of the 3D touch panel. No further description will be given here. Relevant description on the determination of the touch force by the force detection module 42 through the wirings connected with the touch electrodes may also refer to relevant description on the embodiments of the 3D touch panel.

In the 3D touch panel, in actual application, as error touch may occur, in order to avoid unnecessary response caused by error touch, for instance, the force detection module 42 is specifically configured to: detect the capacitance variation between the first touch electrodes and the second touch electrodes through the first wirings and the second wirings; determine whether the variation is greater than the predetermined value; and determine the touch force according to the variation only when the variation is determined to be greater than the predetermined value.

Figure 5:
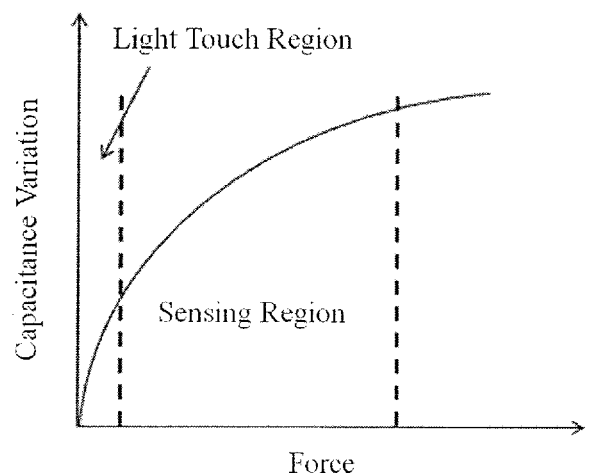
FIG. 5 is a schematic diagram illustrating the change of the capacitance variation of touch capacitors along with the touch force during the touch drive of the 3D touch panel by the touch drive device provided by one embodiment of the present invention.

For instance, as illustrated in FIG. 5, when the touch force is lower than the predetermined value (namely light touch regions), the touch is determined to be error touch; and when the touch force is greater than the predetermined value (namely sensing regions), the touch is determined to be normal touch, and the touch force is determined by calculation.

For instance, the position detection module 41 and the force detection module 42 may be achieved by various circuits. For instance, the position detection module 41 may be achieved by a touch detection integrated circuit (IC). For instance, the force detection module 42 may include an element for detecting the capacitance and a comparator for comparing the capacitance obtained by detection with the default value.

The embodiment of the present invention further provides a display device, which comprises the foregoing 3D touch panel and the foregoing touch drive device. The 3D touch panel can reasonably utilize the internal space of the display device and hence achieve 3D touch function.

The embodiment of the present invention further provides a touch drive method, used for the touch drive of the 3D touch panel as mentioned above, which comprises: detecting the touch position through the position touch layer; and determining the touch force by the detection of the capacitance variation between the first touch electrodes and the second touch electrodes.

In some examples, the step of determining the touch force includes: detecting the capacitance variation between the first touch electrodes and the second touch electrodes; determining whether the variation is greater than the predetermined value; and determining the touch force according to the variation only when the variation is determined to be greater than the predetermined value.

It should be noted that the display device provided by the embodiment may be: any product or component with display function such as a display panel, e-paper, a mobile phone, a tablet PC, a TV, a notebook computer, a digital picture frame and a navigator.

The foregoing is only the preferred embodiments of the present invention and not intended to limit the scope of protection of the present invention. The scope of protection of the present invention should be defined by the appended claims.

The application claims priority to the Chinese patent application No. 201610162616.8, filed Mar. 21, 2016, the disclosure of which is incorporated herein by reference as part of the application.

The invention claimed is:

1. A three-dimensional (3D) touch panel, comprising a display backplate and a cover plate which are arranged opposite to each other, wherein
the display backplate includes a display substrate, a plurality of first touch electrodes and first wirings connected with the plurality of first touch electrodes, formed on a surface of the display substrate facing the cover plate, and a plurality of spacers formed on the first touch electrodes;
the cover plate includes a cover plate substrate, a plurality of second touch electrodes and second wirings connected with the plurality of second touch electrodes, formed on a surface of the cover plate substrate facing the display backplate, and a position touch layer formed on a surface of the cover plate substrate away from the display backplate;
the position touch layer is configured to detect a touch position; and the first touch electrodes and the second touch electrodes correspond to each other in position and are both disposed at the spacers, the display backplate further includes a plurality of pixel units formed on the display substrate; each pixel unit includes a pixel electrode, an organic emission layer and a common electrode; and
the pixel electrodes in the pixel units and the first touch electrodes are arranged in a same layer, the display backplate further includes:
a pixel define layer, wherein a portion of the pixel define layer is formed between the first touch electrodes and the pixel electrodes and another portion of the pixel define layer is provided between the first touch electrode and the spacer, the pixel define layer entirely covers a top surface of the first touch electrode and, wherein
projections of the first touch electrode, the pixel define layer, the spacer, and the second touch electrode on the display substrate in a direction perpendicular to the display substrate overlap.

2. The 3D touch panel according to claim 1, wherein the first touch electrodes and the second touch electrodes are opposite to each other to form a plurality of touch electrode couples; and the first touch electrode and the second touch electrode in each touch electrode couple are respectively disposed at one end of corresponding spacer facing display backplate and one end of the corresponding spacer facing the cover plate.

3. The 3D touch panel according to claim 1, wherein the spacers and the pixel define layer are made of a same material.

4. The 3D touch panel according to claim 1, wherein the spacers are made of an elastic insulating material.

5. The 3D touch panel according to claim 2, wherein a capacitor is formed by the first touch electrode and the second touch electrode in each touch electrode couple.

6. A method for manufacturing a 3D touch panel, comprising:
forming a display backplate;
forming a cover plate; and
bonding the display backplate and the cover plate, and forming a plurality of spacers between the display backplate and the cover plate; wherein
forming the display backplate includes:
forming a plurality of first touch electrodes and first wirings connected with the plurality of first touch electrodes on a surface of a display substrate facing the cover plate;
forming the cover plate includes:
forming a plurality of second touch electrodes and second wirings connected with the plurality of second touch electrodes on a surface of a cover plate substrate facing the display backplate; and
forming a position touch layer on a surface of the cover plate substrate away from the display backplate, in which the position touch layer is configured to detect a touch position, and wherein the plurality of first touch electrodes on the display substrate and the plurality of second touch electrodes on the cover plate are opposite to each other to form a plurality of touch electrode couples after bonding the display backplate and the cover plate, and the first touch electrode and the second touch electrode in each touch electrode couple are respectively disposed at one end of the corresponding spacer facing the display backplate and one end of the corresponding spacer facing the cover plate,
forming the display backplate further includes:
forming a plurality of pixel units on the display substrate, in which each pixel unit includes a pixel electrode, an organic emission layer and a common electrode; and
forming the pixel electrodes in the pixel units in the pixel units includes: forming the pixel electrodes in a same process of forming the first touch electrodes,
the method further comprises forming a pixel define layer, wherein a portion of the pixel define layer is formed between the first touch electrodes and the pixel electrode, wherein and another portion of the pixel define layer is provided between the first touch electrode and the spacer, the pixel define layer entirely covers a top surface of the first touch electrode and, wherein projections of the first touch electrode, the pixel define layer, the spacer, and the second touch electrode on the display substrate in a direction perpendicular to the display substrate overlap.

7. The manufacturing method according to claim 6, wherein forming the spacers and the pixel define layer includes:
forming an insulating material layer on the first touch electrodes; and
patterning the insulating material layer via a half-mask process to obtain an insulating material layer pattern, the insulating material layer pattern including the spacers and the pixel define layer.

8. A touch drive device, configured for touch driving of the 3D touch panel according to claim 1, comprising:
a position detection module configured to determine a touch position by touch drive detection through the position touch layer; and
a force detection module configured to determine a touch force by detection of capacitance variation between the first touch electrodes and the second touch electrodes through the first wirings and the second wirings.

9. The device according to claim 8, wherein determining the touch force includes: detecting the capacitance variation between the first touch electrodes and the second touch electrodes; determining whether the variation is greater than a predetermined value; and determining the touch force according to the variation only when the variation is determined to be greater than the predetermined value.

10. A display device, comprising the 3D touch panel according to claim 1 and the touch drive device according to claim 8.

11. A touch drive method, used for driving of the 3D touch panel according to claim 1, comprising:
- detecting the touch position through the position touch layer; and
- determining a touch force by detection of capacitance variation between the first touch electrodes and the second touch electrodes.

12. The touch drive method according to claim 11, wherein determining the touch force includes: detecting the capacitance variation between the first touch electrodes and the second touch electrodes; determining whether the variation is greater than a predetermined value; and determining the touch force according to the variation only when the variation is determined to be greater than the predetermined value.

\* \* \* \* \*